US011249680B2

(12) United States Patent
Park et al.

(10) Patent No.: US 11,249,680 B2
(45) Date of Patent: Feb. 15, 2022

(54) METHODS, CONTROLLERS, AND SEMICONDUCTOR SYSTEMS FOR GENERATING WRITE COMMANDS

(71) Applicant: SK hynix Inc., Icheon-si (KR)

(72) Inventors: Min Su Park, Seoul (KR); Dong Kyun Kim, Cheongju-si (KR); Sang Sic Yoon, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 182 days.

(21) Appl. No.: 16/584,417

(22) Filed: Sep. 26, 2019

(65) Prior Publication Data
US 2020/0310689 A1    Oct. 1, 2020

(30) Foreign Application Priority Data
Apr. 1, 2019  (KR) .................. 10-2019-0037777

(51) Int. Cl.
*G06F 3/00*    (2006.01)
*G06F 3/06*    (2006.01)
*G11C 7/22*    (2006.01)
*G11C 7/10*    (2006.01)

(52) U.S. Cl.
CPC .......... *G06F 3/0659* (2013.01); *G06F 3/0604* (2013.01); *G06F 3/0673* (2013.01); *G11C 7/1048* (2013.01); *G11C 7/1096* (2013.01); *G11C 7/22* (2013.01)

(58) Field of Classification Search
None
See application file for complete search history.

(56) References Cited

U.S. PATENT DOCUMENTS

| 8,804,441 | B1 | 8/2014 | Swanson | |
| 2019/0259431 | A1* | 8/2019 | Penney | G11C 7/1093 |
| 2021/0225426 | A1* | 7/2021 | Moon | H01L 25/18 |

FOREIGN PATENT DOCUMENTS

KR    1020130112552 A    10/2013

* cited by examiner

*Primary Examiner* — Midys Rojas
(74) *Attorney, Agent, or Firm* — William Park & Associates Ltd.

(57) ABSTRACT

A semiconductor system includes a semiconductor device and a controller. The semiconductor device includes a first memory rank and is configured to perform, in response to receiving a first write command, a first write operation of writing first data to the first memory rank. The semiconductor device includes a second memory rank and is configured to perform, in response to receiving a second write command, a second write operation of writing second data to the second memory rank. The controller is configured to receive at least one write request and responsively generate the first and second write commands separated in time so that a transition time interval between generation of the first write command and generation of the second write command is based on the second memory rank being different from the first memory rank and based on a comparison of a write preamble period to a write post-amble period.

20 Claims, 10 Drawing Sheets ably write to a plurality of memory ranks.

METHODS, CONTROLLERS, AND SEMICONDUCTOR SYSTEMS FOR GENERATING WRITE COMMANDS

CROSS-REFERENCE TO RELATED APPLICATIONS

The present application claims priority under 35 U.S.C. § 119(a) to Korean Application No. 10-2019-0037777, filed on Apr. 1, 2019, which is incorporated herein by reference in its entirety.

BACKGROUND

1. Technical Field

Embodiments of the present disclosure relate to semiconductor systems including memory and, more particularly, to a controller for writing to a plurality of memory ranks.

2. Related Art

Semiconductor systems, in some instances, include a semiconductor device having a plurality of memory ranks sharing a single channel to provide a large capacity of memory. In successively writing to different memory ranks, a channel bubble occurs between the completion of the preceding write operation and the initiation of the following write operation to the different memory rank. The channel bubble, for example, represents a time interval including the cumulative time of a post-amble period for a data strobe signal for the previous write operation, an on-die termination period between the data strobe signal DQS for the previous write operation and a data strobe signal DQS for the following write operation, and a preamble period for the data strobe signal for the following write operation.

The duration of time the channel bubble represents in writing to different memory ranks can be undesirable in some applications. Further, the channel bubble can grow with an increase in the post-amble and/or preamble periods.

SUMMARY

In accordance with an embodiment of the present disclosure, a semiconductor system includes a semiconductor device and a controller. The semiconductor device includes a first memory rank and is configured to perform, in response to receiving a first write command, a first write operation of writing first data to the first memory rank. The semiconductor device also includes a second memory rank and is configured to perform, in response to receiving a second write command, a second write operation of writing second data to the second memory rank. The controller is configured to receive at least one write request and responsively generate the first and second write commands separated in time so that a transition time interval between generation of the first write command and generation of the second write command is based on the second memory rank being different from the first memory rank and based on a comparison of a write preamble period to a write post-amble period.

Also in accordance with an embodiment of the present disclosure, a controller for controlling a semiconductor device to successively write to different memory ranks includes a command generation circuit. The command generation circuit is configured to determine, while a first write operation to a first memory rank is being performed, that a second write operation to a second memory rank different from the first memory rank is to be next performed. The command generation circuit is also configured to generate a second write command for the second write operation based on a comparison of durations of a post-amble period for the first write operation and a preamble period for the second write operation.

Further in accordance with an embodiment of the present disclosure, a method performed by a controller for generating a write command to write to a different memory rank from a preceding memory rank written to includes determining that a first write operation to a first memory rank is being performed and determining that a second memory rank to be next written to in a second write operation is different from the first memory rank. The method also includes comparing durations of a preamble period and a post-amble period for a data strobe signal. The method further includes generating a write command for the second write operation at a time so that a transition time interval between initiation of the first write operation and initiation of the second write operation is based on the determination that the second memory rank is different from the first memory rank and based on the comparison of the durations of the preamble period to the post-amble period.

BRIEF DESCRIPTION OF THE DRAWINGS

The accompanying figures, where like reference numbers refer to identical or functionally similar elements throughout the separate views, form part of the specification and illustrate embodiments in accordance with the included claims.

Figure 1:
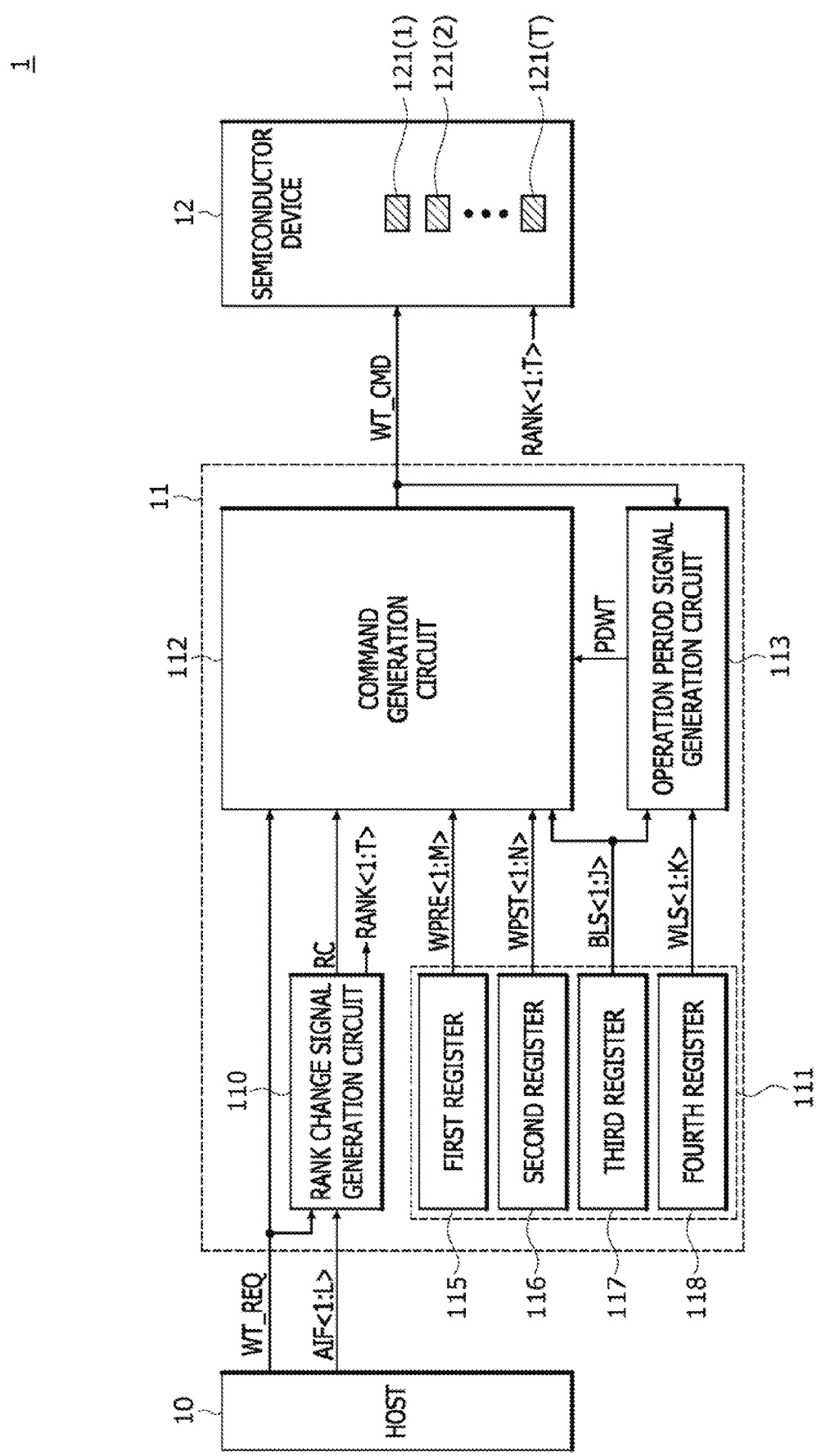
FIG. 1 shows a block diagram illustrating a configuration of a semiconductor system, in accordance with an embodiment of the present disclosure.

The present disclosure includes examples illustrated by accompanying figures. However, the present disclosure is not limited these figures. Skilled artisans will appreciate that elements in the figures are illustrated for simplicity and clarity and have not necessarily been drawn to scale. For example, the dimensions of some of the elements in the figures may be exaggerated relative to the dimensions of other elements to help to improve understanding of embodiments implicitly or explicitly disclosed herein.

System components have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION OF THE EMBODIMENTS

The present disclosure includes embodiments directed to reducing channel bubbles when successively writing to different memory ranks. In some instances, embodiments include "overlapping" post-amble periods with preamble periods for data strobe signals. For example, a post-amble period for a data strobe signal associated with a previous write operation is overlapped with a preamble period for a data strobe signal associated with a following write operation, where the previous and following write operations write data to different memory ranks.

Referring to the figures, FIG. 1 shows a block diagram illustrating a configuration of a semiconductor system 1, in accordance with some embodiments. The semiconductor system 1 is shown to include a host 10, a controller 11, and a semiconductor device 12.

The host 10 outputs a write request WT_REQ and first to $L^{th}$ address information signals AIF<1:L> to the controller 11. The host 10 generates and outputs the write request WT_REQ and the first to $L^{th}$ address information signals AIF<1:L> to perform a write operation involving one or more memory ranks selected from among first to $T^{th}$ memory ranks 121(1:T) included in the semiconductor device 12. A logic level of the write request WT_REQ generated for execution of the write operation may be set differently for different embodiments. A logic level combination of the first to $L^{th}$ address information signals AIF<1:L> for selecting one or more memory ranks for performing the write operation among the first to $T^{th}$ memory ranks 121(1:T) may be set differently for different embodiments.

The controller 11 is shown to include a rank change signal generation circuit 110, a register circuit 111, a command generation circuit 112, and an operation period signal generation circuit 113. The register circuit 111 is shown include a first register 115, a second register 116, a third register 117, and a fourth register 118.

The rank change signal generation circuit 110 generates a rank change signal RC based on the write request WT_REQ and the first to $L^{th}$ address information signals AIF<1:L>. The rank change signal generation circuit 110 also generates first to $T^{th}$ rank signals RANK<1:T>, which include information on a selected memory rank according to the first to $L^{th}$ address information signals AIF<1:L>. For example, the rank change signal generation circuit 110 may generate the first to $T^{th}$ rank signals RANK<1:T> for which only the second rank signal RANK<2> is selectively activated when a write operation to the second memory rank 121(2) is to be performed. The rank change signal indicates when successive write operations involve different memory ranks. For example, when a write operation to the first memory rank 121(1) and a write operation to the second memory rank 121(2) are sequentially performed, the rank change signal is activated, indicating a change in memory rank, because a logic level combination of the first to $L^{th}$ address information signals AIF<1:L> when a write request WT_REQ is generated a first time is different from a logic level combination of the first to $L^{th}$ address information signals AIF<1: L> when a write request WT_REQ is generated a second time. A logic level of the activated rank change signal RC may be set as a logic "high" level or a logic "low" level, according to an embodiment. A configuration and a method of operation of the rank change signal generation circuit 110 are described in detail below with reference to FIGS. 2 and 3.

The first register 115 stores and outputs first to $M^{th}$ preamble period signals WPRE<1:M>. The first to $M^{th}$ preamble period signals WPRE<1:M> have a logic level combination corresponding to a preamble period of a data strobe signal DQS, shown in FIG. 6, used in encoding data to be written to the memory ranks of the semiconductor device 12. For example, when the preamble period of the data strobe signal DQS is '1xtCK,' the first to third preamble period signals WPRE<1:3> have a logic level combination of '001.' When the preamble period of the data strobe signal DQS is '1.5xtCK,' the first to third preamble period signals WPRE<1:3> have a logic level combination of '010.'

Figure 6:
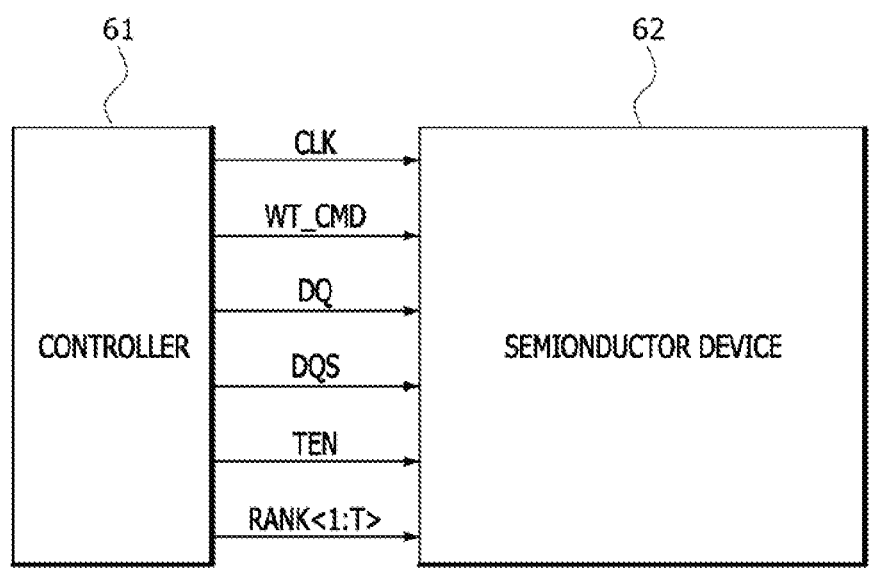
FIG. 6 shows a block diagram illustrating a configuration of a semiconductor system, in accordance with an embodiment of the present disclosure.

A preamble period of '1xtCK' has a duration of one cycle of a clock signal CLK, shown in FIG. 6, associated with encoding data to be written to the memory ranks of the semiconductor device 12. A preamble period of '1.5xtCK' has a duration of one and a half cycles of the clock signal CLK.

A logic level combination written as a binary string for a set of signals indicates which signals among the set of signals have a logic "low" level and which signals among the set of signals have a logic "high" level. For example, a logic level combination of '001' for the first to third preamble period signals WPRE<1:3> means that the first and second preamble period signals WPRE<1:2> have a logic "low" level, and the third preamble period signal WPRE<3> has a logic "high" level. A logic level combination of '010' for the first to third preamble period signals WPRE<1:3> means that the first and third preamble period signals WPRE<1> and WPRE<3> have a logic "low" level, and the second preamble period signal WPRE<2> has a logic "high" level.

The second register 116 stores and outputs first to $N^{th}$ post-amble period signals WPST<1:N>. The first to $N^{th}$ post-amble period signals WPST<1:N> have a logic level combination corresponding to a post-amble period of the data strobe signal DQS. For example, when the post-amble period of the data strobe signal DQS is '1xtCK,' the first to third post-amble period signals WPST<1:3> have a logic level combination of '001.' When the post-amble period of the data strobe signal DQS is '1.5xtCK,' the first to third post-amble period signals WPST<1:3> have a logic level combination of '010.'

The third register 117 stores and outputs first to $J^{th}$ burst length signals BLS<1:J>. The first to $J^{th}$ burst length signals BLS<1:J> have a logic level combination corresponding to the number bits (i.e., a burst length) of data DQ which are continuously outputted by one write command. For example, the burst length may be set as four when the first to third burst length signals BLS<1:3> have a logic level combination of '001', the burst length may be set as eight when the first to third burst length signals BLS<1:3> have a logic level combination of '010', and the burst length may be set as sixteen when the first to third burst length signals BLS<1:3> have a logic level combination of '011'. In the first to third burst length signals BLS<1:3>, the logic level combination of '001' means that the first and second burst length signals BLS<1:2> have a logic "low" level and the third burst length signal BLS<3> has a logic "high" level. Moreover, the logic level combination of '010' means that the first and third burst length signals BLS<1> and BLS<3> have a logic "low" level and the second burst length signal BLS<2> has a logic "high" level. Furthermore, the logic level combination of '011' means that the first burst length signal BLS<1> has a logic "low" level and the second and third burst length signals BLS<2:3> have a logic "high" level. When the burst length is set to be sixteen, sixteen bits of the data DQ may be continuously inputted or outputted by one command.

The fourth register 118 may store and output first to $K^{th}$ write latency signals WLS<1:K>. The first to $K^{th}$ write latency signals WLS<1:K> have a logic level combination corresponding to a write latency. For example, the write latency may be set as two when the first to third write latency signals WLS<1:3> have a logic level combination of '001', the write latency may be set as three when the first to third write latency signals WLS<1:3> have a logic level combination of '010', and the write latency may be set as four when the first to third write latency signals WLS<1:3> have a logic level combination of '011'. In the first to third write latency signals WLS<1:3>, the logic level combination of '001' means that the first and second write latency signals WLS<1:2> have a logic "low" level and the third write latency signal WLS<3> has a logic "high" level. Moreover, the logic level combination of '010' means that the first and third write latency signals WLS<1> and WLS<3> have a logic "low" level and the second write latency signal WLS<2> has a logic "high" level. Furthermore, the logic level combination of '011' means that the first write latency signal WLS<1> has a logic "low" level and the second and third write latency signals WLS<2:3> have a logic "high" level.

The command generation circuit 112 generates a write command WT_CMD based on a write request WT_REQ, the rank change signal RC, the first to $M^{th}$ preamble period signals WPRE<1:M>, the first to $N^{th}$ post-amble period signals WPST<1:N>, the first to $J^{th}$ burst length signals BLS<1:J>, and an operation period signal PDWT.

In some instances, the command generation circuit 112 receives a write request WT_REQ when a current write operation is not being performed. The command generation circuit 112 may generate a write command WT_CMD when the write request WT_REQ is received while a write operation is not being performed. The command generation circuit 112 may recognize that a write operation is not currently being performed when the operation period signal PDWT is inactivated.

In some instances, the command generation circuit 112 receives a write request WT_REQ for a write operation while an earlier write operation is still being performed and both write operations involve the same memory rank. The command generation circuit 112 may generate a write commands WT_CMD at a time when a period, determined by the burst length, elapses from a time when a previous write command WT_CMD was generated while write operations to a single memory rank are repeatedly performed. The command generation circuit 112 may recognize that write operations to a single memory rank are being repeatedly performed when an activated operation period signal PDWT and an inactivated rank change signal RC are inputted to the command generation circuit 112.

In some instances, the command generation circuit 112 receives one or more write requests WT_REQ for successively writing to different memory ranks when the preamble period of the data strobe signal DQS is greater than the post-amble period of the data strobe signal DQS. The command generation circuit 112 may generate a write command WT_CMD at a time when the preamble period of the data strobe signal DQS plus a period dependent on the burst length have elapsed from when the previous write command WT_CMD was generated.

In some instances, the command generation circuit 112 receives one or more write requests WT_REQ for successively writing to different memory ranks when the preamble period of the data strobe signal DQS is less than, or for some embodiments, equal to or less than, the post-amble period of the data strobe signal DQS. The command generation circuit 112 may generate a write command WT_CMD at a time when the post-amble period of the data strobe signal DQS plus a number of clock cycles of the data strobe signal DQS plus a period dependent on the burst length have elapsed from when the previous write command was generated.

The command generation circuit 112 may recognize that successive write operations to different memory ranks are being sequentially performed when the command generation circuit 112 receives the activated operation period signal PDWT and the activated rank change signal RC. The command generation circuit 112 may identify the preamble period of the data strobe signal DQS according to a logic level combination of the first to $M^{th}$ preamble period signals WPRE<1:M>, may identify the post-amble period of the data strobe signal DQS according to a logic level combination of the first to $N^{th}$ post-amble period signals WPST<1:N>, and may identify the burst length according to a logic level combination of the first to $J^{th}$ burst length signals BLS<1:J>.

A configuration and a method of operation of the command generation circuit 112 are described in detail below with reference to FIGS. 5 and 6.

The operation period signal generation circuit 113 generates the operation period signal PDWT based on a write command WT_CMD, the first to $J^{th}$ burst length signals BLS<1:J>, and the first to $K^{th}$ write latency signals WLS<1:K>. The operation period signal PDWT is activated and maintains an activated status during a write operation. That a write operation is currently being performed is determined by the operation period signal generation circuit 113 based on the first to $K^{th}$ write latency signals WLS<1:K>, the first to $J^{th}$ burst length signals BLS<1:J>, and the write command WT_CMD the operation period signal generation circuit 113 receives.

The semiconductor device 12 may include the first to $T^{th}$ memory ranks 121(1:T). The semiconductor device 12 may perform a write operation to a memory rank selected from among the first to $T^{th}$ memory ranks 121(1:T) based on a write command WT_CMD and the first to $T^{th}$ rank signals RANK<1:T>. For example, the semiconductor device 12 may perform a write operation to the second memory rank 121(2) when a write command WT_CMD is generated while the second rank signal RANK<2> is activated.

Figure 2:
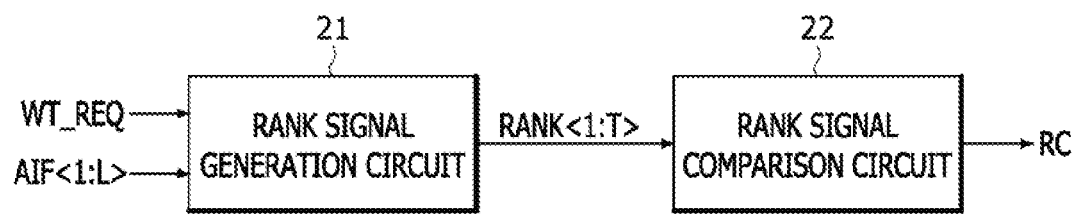
FIG. 2 shows a block diagram illustrating a rank change signal generation circuit included in the semiconductor system of FIG. 1, in accordance with an embodiment of the present disclosure.

The rank change signal generation circuit 110 generates the rank change signal RC, which indicates a change in memory rank for successive write operations. Referring to FIG. 2, the rank change signal generation circuit 110 is shown to include a rank signal generation circuit 21 and a rank signal comparison circuit 22.

In accordance with an embodiment, the rank signal generation circuit 21 receives a write request WT_REQ and the first to $L^{th}$ address information signals AIF<1:L> to generate the first to $T^{th}$ rank signals RANK<1:T>. The first to $T^{th}$ rank signals RANK<1:T> include information on the memory rank selected by the first to $L^{th}$ address information signals AIF<1:L> when a write request WT_REQ is generated. For example, the rank change signal generation circuit 110 may generate the first rank signal RANK<1> having an inactivated status, the second rank signal RANK<2> having an activated status, and the third to $T^{th}$ rank signals RANK<3:T> having an inactivated status when a write operation to the second memory rank 121(2) is to be performed.

The rank signal comparison circuit 22 generates the rank change signal RC based on the first to $T^{th}$ rank signals RANK<1:T>. The rank change signal RC is activated by the rank signal comparison circuit 22 when a memory rank to be written to is different from the previous memory rank that was written to. For example, when a first write operation to the first memory rank 121(1) and a second write operation to the second memory rank 121(2) are sequentially performed, the rank change signal generation circuit 110 activates the rank change signal RC. This is because a logic level combination of the first to $L^{th}$ address information signals AIF<1:L> inputted when a first write request WT_REQ, associated with the first write operation, is generated is different from a logic level combination of the first to $L^{th}$ address information signals AIF<1:L> inputted when a second write request WT_REQ, associated with the second write operation, is generated.

Figure 3:
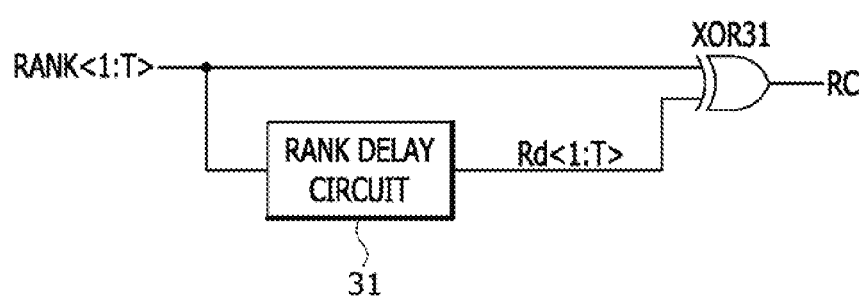
FIG. 3 shows a block diagram illustrating a rank signal comparison circuit included in the rank change signal generation circuit of FIG. 2, in accordance with an embodiment of the present disclosure.

Referring to FIG. 3, the rank signal comparison circuit 22 is shown to include a rank delay circuit 31 and an exclusive OR logic gate XOR31. The rank delay circuit 31 delays the first to $T^{th}$ rank signals RANK<1:T> to generate first to $T^{th}$ delayed rank signals Rd<1:T>. In an embodiment, the delay introduced by the rank delay circuit is matched to an amount of time used to perform a write operation. For example, with the delay matched to the amount of time it takes to perform the first write operation, the delayed rank signals Rd<1:T> will indicate the memory rank written to for the first write operation when the rank signals RANK<1:T> indicate the memory rank being written to for the next-performed second write operation. The rank signals RANK<1:T> are compared to the delayed rank signals Rd<1:T> by the exclusive or gate XOR31. When the sequence of logic levels for the rank signals RANK<1:T> does not match the sequence of logic levels for the delayed rank signals Rd<1:T>, the exclusive or gate XOR31 outputs the rank change signal with a logic "high" level, indicating a change in memory rank between the first and second write operations.

Figure 4:
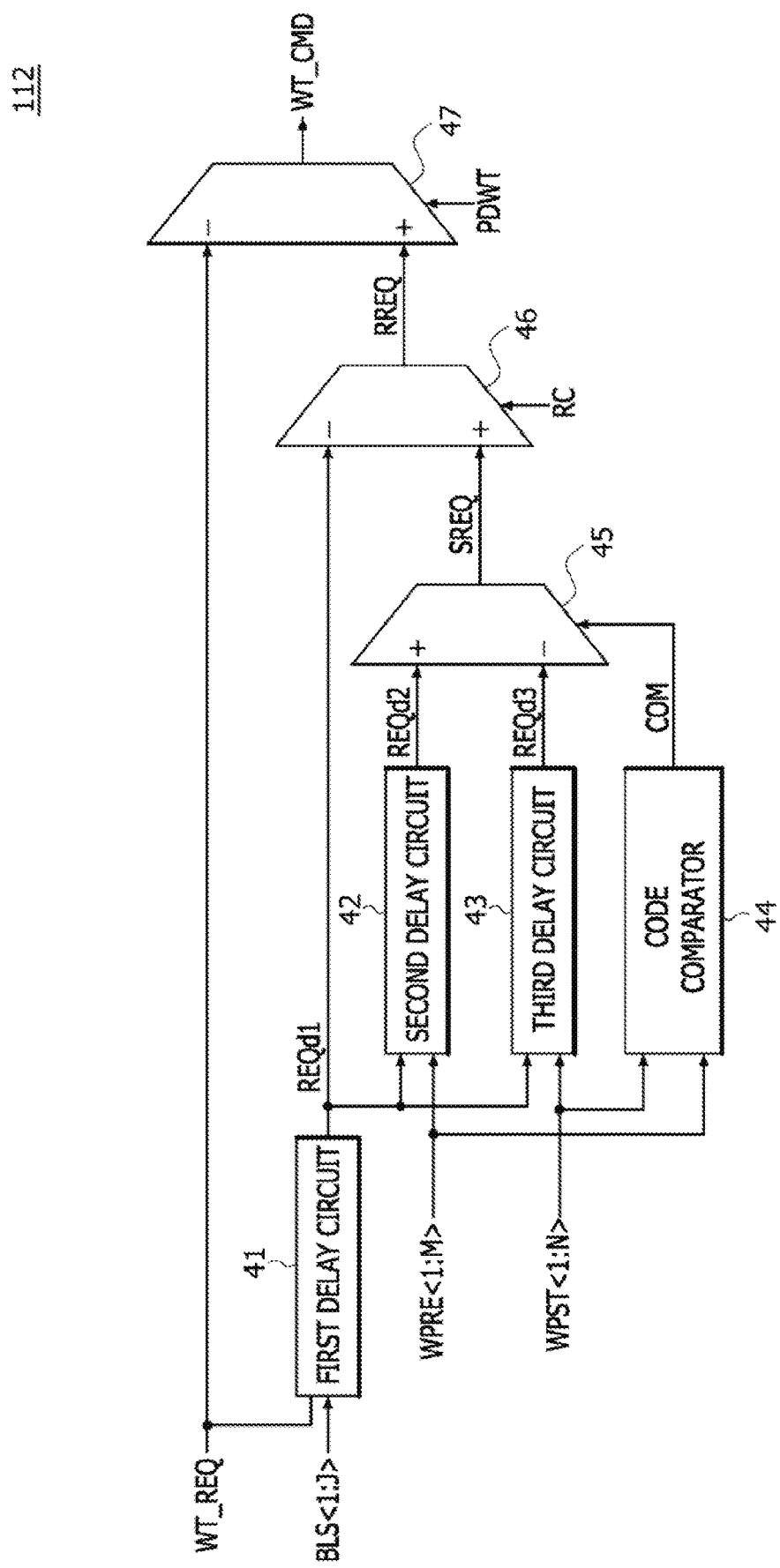
FIG. 4 shows a block diagram illustrating a command generation circuit included in the semiconductor system of FIG. 1, in accordance with an embodiment of the present disclosure.

The command generation circuit 112 generates write commands WT_CMD, which initiate write operations to the semiconductor device 12. Referring to FIG. 4, the command generation circuit 112 is shown to include a first delay circuit 41, a second delay circuit 42, a third delay circuit 43, a code comparator 44, a selection request output circuit 45, a rank request output circuit 46, and a write command output circuit 47.

The first delay circuit 41 delays a write request WT_REQ based on the first to $J^{th}$ burst length signals BLS<1:J> to generate a first delayed request REQd1. The first delay circuit 41 may delay the write request WT_REQ by a period determined from the first to $J^{th}$ burst length signals BLS<1:J> to generate the first delayed request REQd1. In an embodiment, the first delay circuit 41 delays the write request WT_REQ by a half period of the burst length to generate the first delayed request REQd1. For example, when the burst length is set as sixteen, the first delay circuit 41 delays the write request WT_REQ by eight cycles of the clock signal CLK ('8xtCK') to generate the first delayed request REQd1.

The second delay circuit 42 delays the first delayed request REQd1 based on the first to $M^{th}$ preamble period signals WPRE<1:M> to generate a second delayed request REQd2. The second delay circuit 42 may delay the first delayed request REQd1 by a period determined by first to $M^{th}$ preamble period signals WPRE<1:M> to generate the second delayed request REQd2. For example, when the preamble period of the data strobe signal DQS is '2xtCK,' the second delay circuit 42 delays the first delayed request REQd1 by '2xtCK' to generate the second delayed request REQd2.

The third delay circuit 43 delays the first delayed request REQd1 based on the first to $N^{th}$ post-amble period signals WPST<1:N> to generate a third delayed request REQd3. The third delay circuit 43 may delay the first delayed request REQd1 by a period determined by the first to $N^{th}$ post-amble period signals WPST<1:N> to generate the third delayed request REQd3. In an embodiment, the third delay circuit 43 delays the first delayed request REQd1 by the post-amble period of the data strobe signal DQS plus a time period of '1xtCK' to generate the third delayed request REQd3. For example, when the post-amble period of the data strobe signal DQS is '2xtCK,' the third delay circuit 43 delays the first delayed request REQd1 by '3xtCK' to generate the third delayed request REQd3.

The code comparator 44 generates a comparison signal COM based on the first to $M^{th}$ preamble period signals WPRE<1:M> and the first to $N^{th}$ post-amble period signals WPST<1:N>. The code comparator 44 may compare the preamble period of the data strobe signal DQS set by the first to $M^{th}$ preamble period signals WPRE<1:M> with the post-amble period of the data strobe signal DQS set by the first to $N^{th}$ post-amble period signals WPST<1:N> to generate the comparison signal COM. The code comparator 44 may generate the comparison signal COM having a first logic level when the preamble period of the data strobe signal DQS is greater than the post-amble period of the data strobe signal DQS. The code comparator 44 may generate the comparison signal COM having a second logic level when the preamble period of the data strobe signal DQS is less than, or equal to or less than, for some embodiments, the post-amble period of the data strobe signal DQS. In an embodiment, the first logic level may be a logic "high" level, and the second logic level may be a logic "low" level.

The selection request output circuit 45 generates a selection request SREQ from the second delayed request REQd2 or the third delayed request REQd3 based on the comparison signal COM. The selection request output circuit 45 outputs the second delayed request REQd2 as the selection request SREQ when the comparison signal COM has the first logic level. The selection request output circuit 45 outputs the third delayed request REQd3 as the selection request SREQ when the comparison signal COM has the second logic level. For example, the selection request output circuit 45 outputs the second delayed request REQd2 as the selection request SREQ when the preamble period of the data strobe signal DQS is greater than the post-amble period of the data strobe signal DQS. The selection request output circuit 45 outputs the third delayed request REQd3 as the selection request SREQ when the preamble period of the data strobe signal DQS is less than, or equal to or less than, for some embodiments, the post-amble period of the data strobe signal DQS.

The rank request output circuit 46 generates a rank request RREQ from the first delayed request REQd1 or the selection request SREQ based on the rank change signal RC. The rank request output circuit 46 may output the first delayed request REQd1 as the rank request RREQ when the rank change signal RC is inactivated. The rank request output circuit 46 outputs the selection request SREQ as the rank request RREQ when the rank change signal RC is activated. For example, the rank request output circuit 46 outputs the first delayed request REQd1 as the rank request RREQ when a write operation to the same memory rank is repeatedly performed. The rank request output circuit 46 outputs the selection request SREQ as the rank request RREQ when write operations to different memory ranks are successively performed.

The write command output circuit 47 generates a write command WT_CMD from the write request WT_REQ or the rank request RREQ based on the operation period signal PDWT. The write command output circuit 47 may output the write request WT_REQ as the write command WT_CMD when the operation period signal PDWT is inactivated. The write command output circuit 47 may output the rank request RREQ as the write command WT_CMD when the operation period signal PDWT is activated. For example, the write command output circuit 47 outputs the write request WT_REQ as the write command WT_CMD while a write operation is not being performed, and the write command output circuit 47 outputs the rank request RREQ as the write command WT_CMD while a write operation is being performed.

An operation of the command generation circuit 112, in accordance with an embodiment, is described with reference to FIG. 5.

Figure 5:
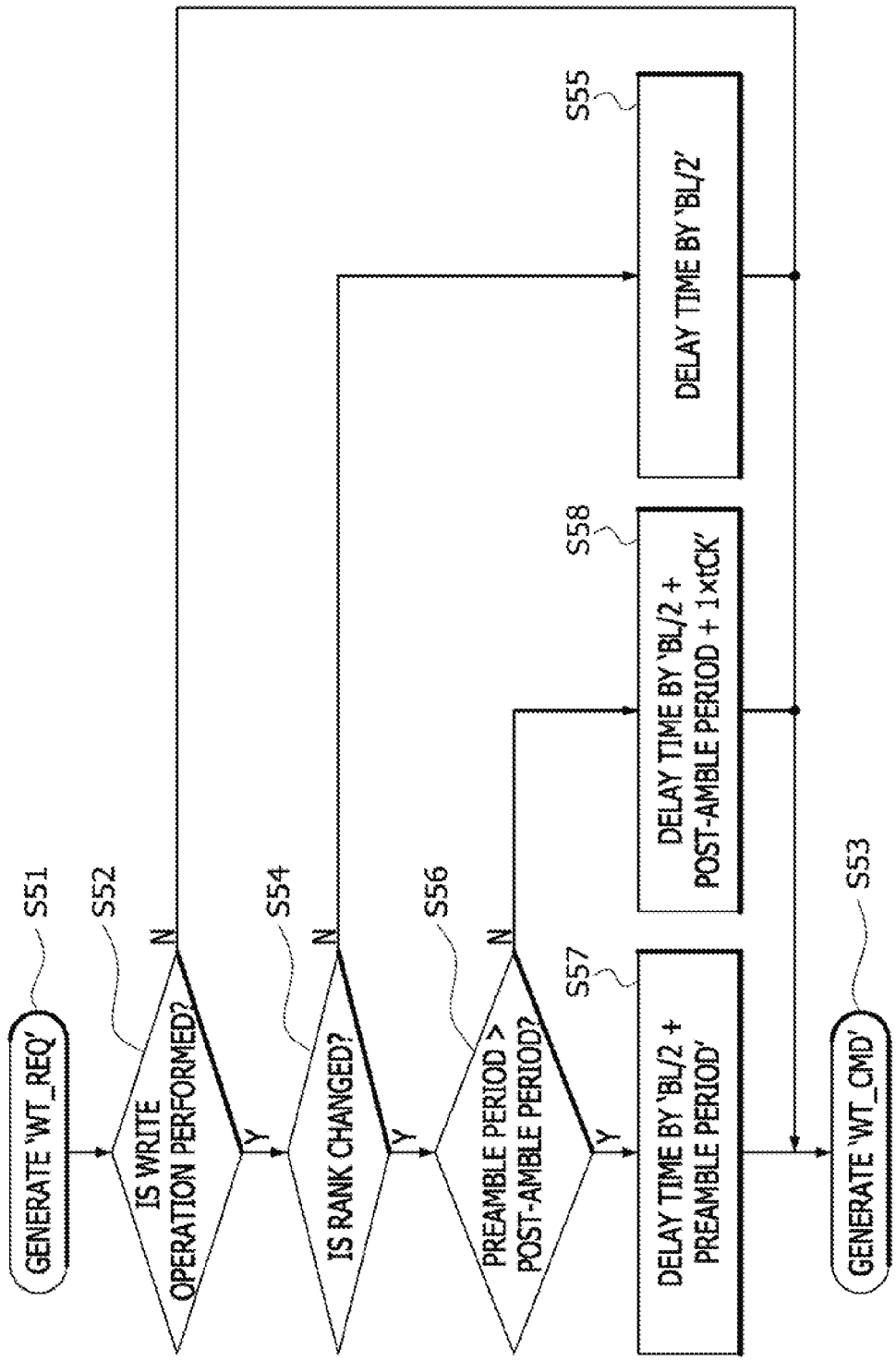
FIG. 5 shows a flowchart illustrating an operation of the command generation circuit shown in FIG. 4, in accordance with an embodiment of the present disclosure.

Referring to FIG. 5, the host 10 generates S51 a write request WT_REQ, which is sent to and received by the rank change signal generation circuit 110 and the command generation circuit 112 of the controller 11. The command generation circuit 112 determines S52, based on the operation period signal PDWT received from the operation period signal generation circuit 113, if a previous write operation is still being performed. A previous write operation, for example, may have been initiated by a previous write request WT_REQ received by the command generation circuit 112 from the host 10.

If the command generation circuit 112 determines S52, based on the operation period signal PDWT received from the operation period signal generation circuit 113, that a previous write operation is not currently being performed, then the command generation circuit 112 generates a write command WT_CMD to perform the write operation associated with the generated S51 write request.

If the command generation circuit 112 determines S52, based on the operation period signal PDWT received from the operation period signal generation circuit 113, that a previous write operation is still being performed, then the command generation circuit 112 determines S54, from the rank change signal RC received from the rank change signal generation circuit 110, if a memory rank associated with the generated S51 write request WT_REQ is different from the memory rank associated with the previous write operation still being performed.

If the command generation circuit 112 determines S54 that these two memory ranks are the same, then the command generation circuit 112 introduces a delay time of half a burst length of the previous write operation before generating S53 the write command WT_CMD associated with the generated S51 write request S51. The delay time is the interval of time between the generation of write commands for successive write operations, also referred to herein as a transition time interval.

If the command generation circuit 112 determines S54 that that memory rank associated with the generated S51 write request WT_REQ is different from the memory rank associated with the previous write operation still being performed, then the command generation circuit 112 determines S56 if a preamble period of the data strobe signal DQS is greater than a post-amble period of the data strobe signal DQS for write operations.

If the command generation circuit 112 determines S56 that the preamble period is not greater than the post-amble period, then then the command generation circuit 112 introduces a transition time interval dependent on the post-amble period and independent of the preamble period. For example, the command generation circuit 112 introduces a transition time interval of half a burst length of the previous write operation plus the post-amble period plus one cycle of the clock '1×tCK' before generating S53 the write command WT_CMD associated with the generated S51 write request S51.

If the command generation circuit 112 determines S56 that the preamble period is greater than the post-amble period, then then the command generation circuit 112 introduces a transition time interval dependent on the preamble period and independent of the post-amble period. For example, the command generation circuit 112 introduces a transition time interval of half a burst length of the previous write operation plus the preamble period before generating S53 the write command WT_CMD associated with the generated S51 write request S51.

Illustrated in FIG. 6 is a semiconductor system 6 according to another embodiment of the present disclosure. The semiconductor system 6 is shown to include a controller 61 and a semiconductor device 62. The controller 61 applies a clock signal CLK, a write command WT_CMD, data DQ, a data strobe signal DQS, a test entry signal TEN, and first to $T^{th}$ rank signals RANK<1:T> to the semiconductor device 62. The controller 61 may generate a write command WT_CMD using the same method of operation as the controller 11 included in the semiconductor system 1 and illustrated in FIG. 1. The semiconductor device 62 may perform a write operation using the same method of operation as the semiconductor device 12 included in the semiconductor system 1 and illustrated in FIG. 1. The test entry signal TEN may be activated in a test mode, which is capable of generating a write command WT_CMD by partially "overlapping" the preamble period of the data strobe signal DQS and the post-amble period of the data strobe signal DQS with each other when write operations to different memory ranks are successively performed. The partial overlapping of the preamble period and the post-amble period is illustrated in FIGS. 7 and 8.

Examples for which write operations to different memory ranks are successively performed in the semiconductor device 62 are described with reference to FIGS. 7 and 8. For FIG. 7, the preamble period is less than the post-amble period. For FIG. 8, the preamble period is greater than the post-amble period.

Figure 7:
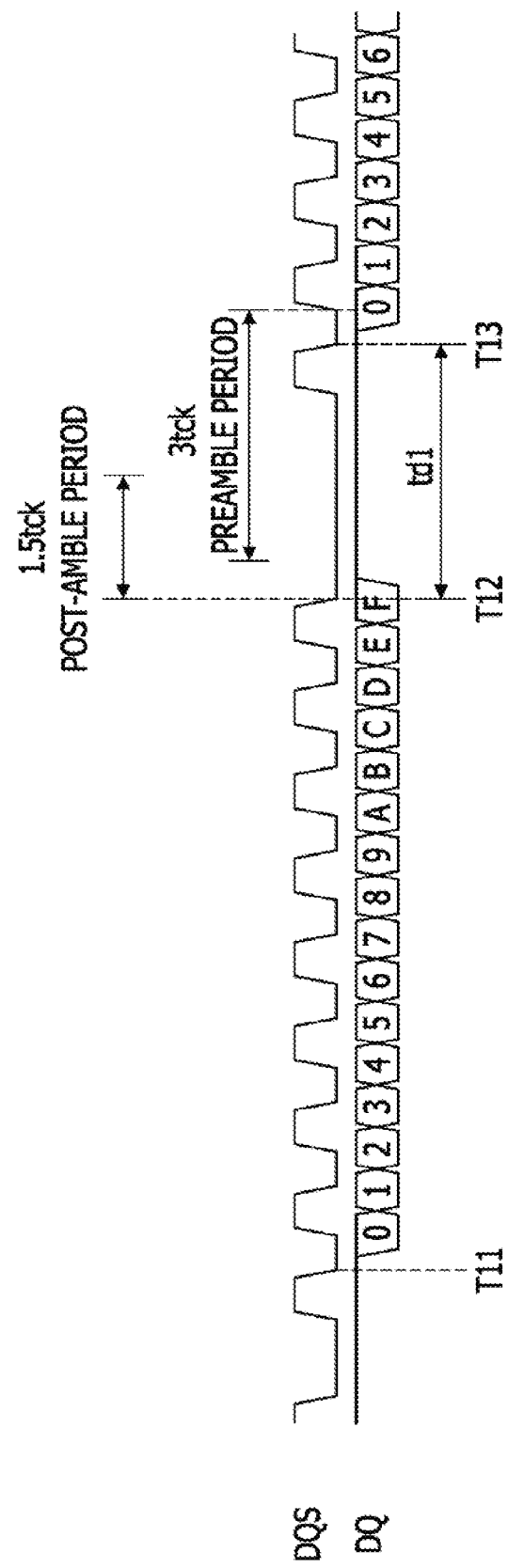
FIG. 7 shows a timing diagram illustrating an operation of the semiconductor system shown in FIG. 6, in accordance with an embodiment of the present disclosure.

As illustrated in FIG. 7, Data DQ having sixteen bits 0-f is inputted to the semiconductor device 62 during a period from a time "T11" until a time "T12" for a first write operation to a first memory rank to be performed with a burst length of sixteen. Also data DQ having sixteen bits 0-f is inputted to the semiconductor device 62 from a time "T13" for a second write operation to a second memory rank, different from the first memory rank, to be performed with a burst length of sixteen. Because the preamble period of the data strobe signal DQS at '3×tCK' is longer than the post-amble period of the data strobe signal DQS at '1.5× tCK,' a write command WT_CMD for the second write operation is generated at the time "T13" when (in accordance with S57 of FIG. 5) a transition time interval of a half period (i.e., '8×tCK') of the burst length plus a period 'td1' equal to the preamble period elapses from the point in time "T11" under the assumption that a write command WT_CMD for the first write operation is generated at time "T11."

Figure 8:
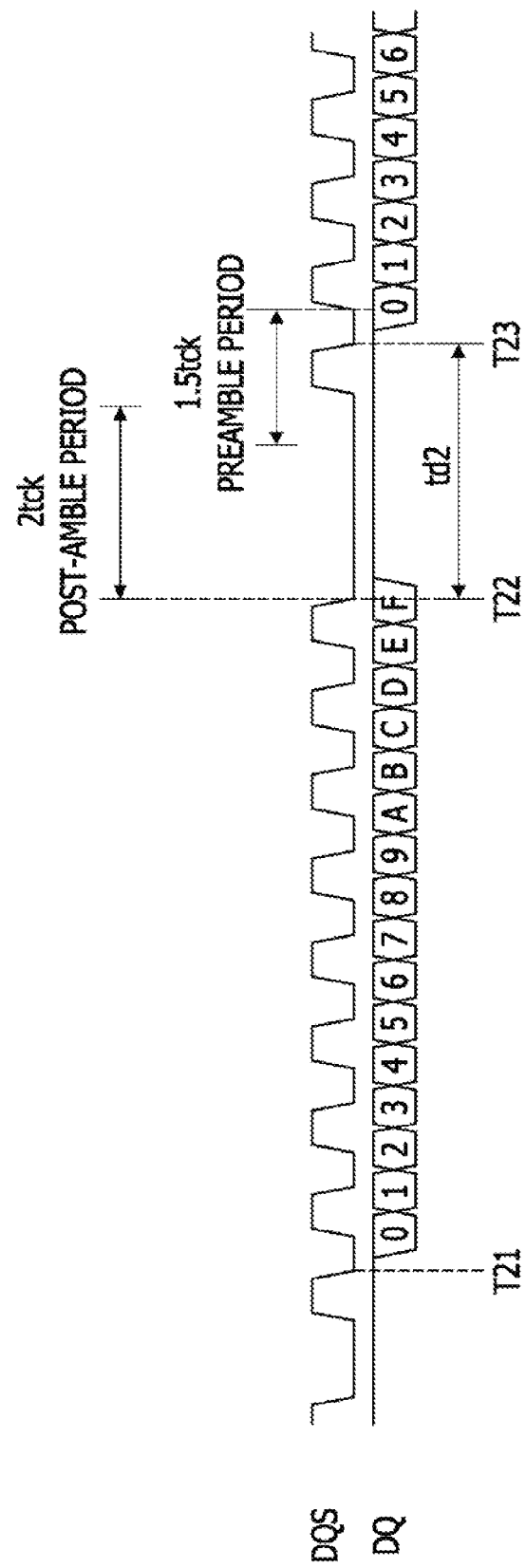
FIG. 8 shows a timing diagram illustrating an operation of the semiconductor system shown in FIG. 6, in accordance with an embodiment of the present disclosure.

As illustrated in FIG. 8, Data DQ having sixteen bits 0-*f* is inputted to the semiconductor device 62 during a period from a time "T21" until a time "T22" for a first write operation to a first memory rank to be performed with a burst length of sixteen. Also data DQ having sixteen bits 0-*f* is inputted to the semiconductor device 62 from a time "T23" for a second write operation to a second memory rank, different from the first memory rank, to be performed with a burst length of sixteen. Because the preamble period of the data strobe signal DQS at '1.5×tCK' is shorter than the post-amble period of the data strobe signal DQS at '2×tCK,' a write command WT_CMD for the second write operation is generated at time "T23" when (in accordance with S58 of FIG. 5) a transition time interval of a half period (i.e., '8×tCK') of the burst length plus a period 'td2' equal to the sum of the post-amble period plus one cycle of the clock elapses from the time "T21" under the assumption that a write command WT_CMD for the first write operation is generated at the time "T21."

As indicated above, the period 'td2' determined by the post-amble period may be set as the post-amble period of '2×tCK' plus a time period of '1×tCK.' In an embodiment, the time period of '1×tCK' included in the period 'td2' is provided to obtain a minimum period necessary for toggling of the data strobe signal DQS during the preamble period of the data strobe signal DQS. Even though the preamble period of the data strobe signal DQS and the post-amble period of the data strobe signal DQS are shown to overlap with each other, the time period '1×tCK' in the preamble period of the data strobe signal DQS may be excluded from the overlapping period for toggling of the data strobe signal DQS. Thus, even if the actual preamble period of the data strobe signal DQS is less than '1×tCK,' a preamble period of the data strobe signal DQS having a minimum period '1×tCK' is provided.

Figure 9:
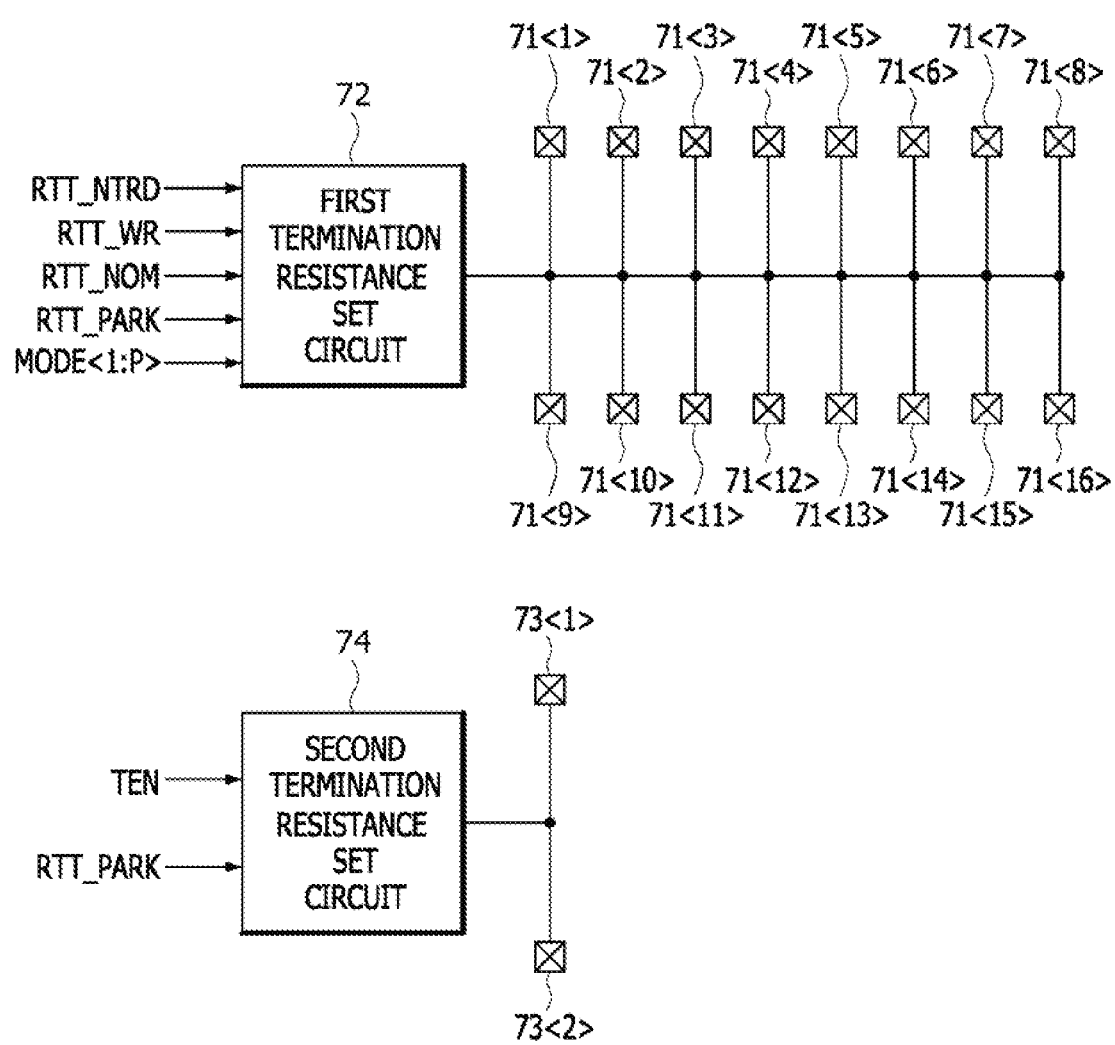
FIG. 9 shows a block diagram illustrating a termination control circuit included in the semiconductor system shown in FIG. 6, in accordance with an embodiment of the present disclosure.

FIG. 9 illustrates a configuration of a termination control circuit 7 included in the semiconductor device 62 shown in FIG. 6, in accordance with an embodiment. The termination control circuit 7 is shown include a first pad group 71<1:16>, a first termination resistance set circuit 72, a second pad group 73<1:2>, and a second termination resistance set circuit 74.

The first pad group 71<1:16> may receive or output data DQ. The second pad group 73<1:2> may receive or output the data strobe signal DQS. In other embodiments, the termination control circuit 7 may be realized to receive or output the data strobe signal DQS through one or more pads included in the first pad group 71<1:16>.

The first termination resistance set circuit 72 may control an impedance value of a termination resistor connected to the first pad group 71<1:16> using first to fourth termination flags RTT_NTRD, RTT_WR, RTT_NOM, and RTT_PARK based on a mode signal MODE<1:P>. The mode signal MODE<1:P> may be set to have various logic level combinations for various internal operations. For example, the first termination resistance set circuit 72 may receive the mode signal MODE<1:P> having a first logic level combination to control the impedance value of the termination resistor connected to the first pad group 71<1:16> to have a first resistance value using the second termination flag RTT_WR when the semiconductor device performs the write operation. The first termination flag RTT_NTRD may be used in the first termination resistance set circuit 72 when a read operation of another rank is performed. The third termination flag RTT_NOM may be used in the first termination resistance set circuit 72 when an on-die termination command is generated without generation of a write command and a read command. The fourth termination flag RTT_PARK may be used in the first termination resistance set circuit 72 when the on-die termination command is not generated.

The second termination resistance set circuit 74 may control an impedance value of a termination resistor connected to the second pad group 73<1:2> using the third termination flag RTT_NOM based on the test entry signal TEN. The second termination resistance set circuit 74 may fix the impedance value of the termination resistor connected to the second pad group 73<1:2> to a predetermined resistance value using the third termination flag RTT_NOM when the test entry signal TEN is activated to enter the test mode.

Figure 10:
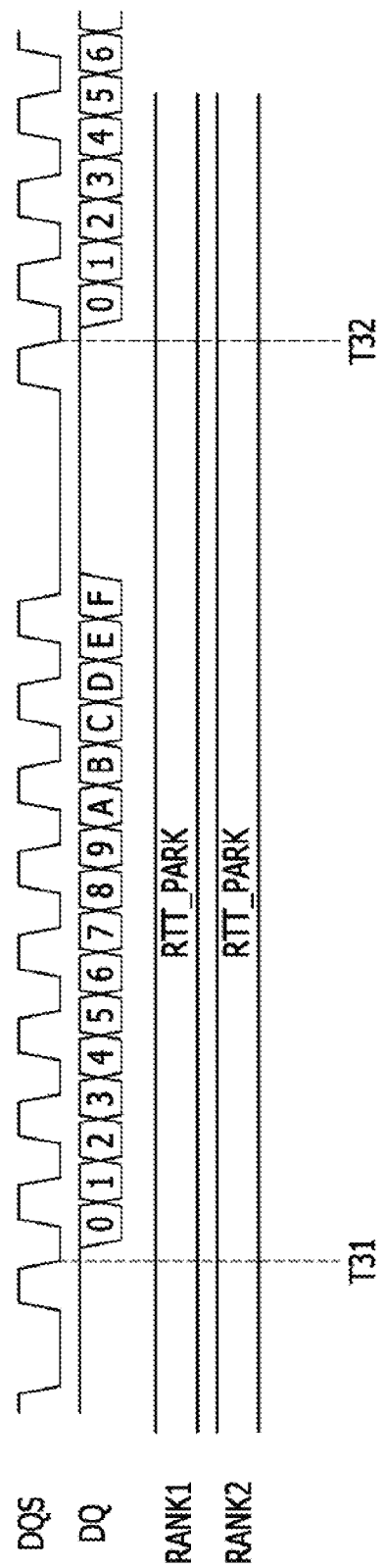
FIG. 10 shows a timing diagram illustrating an operation of the termination control circuit shown in FIG. 9, in accordance with an embodiment of the present disclosure.

Referring to FIG. 10, if the preamble period of the data strobe signal DQS and the post-amble period of the data strobe signal DQS partially overlap each other to enter the test mode which is capable of generating a write command WT_CMD, as described above, when a write operation to a first memory rank RANK1 is performed at a point in time "T31" and a write operation to a second memory rank RANK2 is performed at a point in time "T32," an impedance value of a termination resistor connected to the data strobe signal DQS of the first memory rank RANK1 and an impedance value of a termination resistor connected to the data strobe signal DQS of the second memory rank RANK2 may be fixed to a predetermined value, which is set by the third termination flag RTT_NOM.

As described above, the semiconductor system 6 may be realized to maintain an impedance value of a termination resistor connected to the data strobe signal DQS to be constant if the preamble period of the data strobe signal DQS and the post-amble period of the data strobe signal DQS partially overlap with each other to enter the test mode which is capable of generating a write command WT_CMD, as described above, when write operations to different memory ranks are sequentially performed.

In the foregoing detailed description, specific embodiments have been described. However, one of ordinary skill in the art will appreciate that various modifications and changes can be made to these embodiments without departing from the scope of the disclosure as set forth in the claims below. Accordingly, the specification and figures are to be regarded in an illustrative rather than a restrictive sense, and all such modifications and changes are intended to be included within the scope of present teachings. Any indicated or suggested benefits, advantages, solutions to problems, and any element(s) that may cause any benefit, advantage, or solution to occur or become more pronounced are not to be construed as a critical, required, or essential features or elements of any or all the claims.

What is claimed is:

1. A semiconductor system comprising:
a semiconductor device comprising:
a first memory rank, wherein the semiconductor device is configured to perform, in response to receiving a first write command, a first write operation of writing first data to the first memory rank; and
a second memory rank, wherein the semiconductor device is configured to perform, in response to receiving a second write command, a second write operation of writing second data to the second memory rank; and
a controller configured to receive at least one write request and responsively generate the first and second write commands separated in time so that a transition time interval between generation of the first write command and generation of the second write command is based on the second memory rank being different from the first memory rank and based on a comparison of a write preamble period to a write post-amble period.

2. The semiconductor system of claim 1, wherein the controller comprises a rank change signal generation circuit configured to generate a rank change signal based on the at least one write request and an address information signal, wherein the rank change signal indicates that the second memory rank is different from the first memory rank.

3. The semiconductor system of claim 2, wherein the rank change signal generation circuit comprises a rank signal generation circuit configured to generate at least one rank change signal based on the at least one write request, wherein the at least one rank change signal indicates that the first rank is being written to for the first write operation and later indicates that the second rank is being written to for the second write operation.

4. The semiconductor system of claim 3, wherein the rank change signal generation circuit further comprises a rank signal comparison circuit comprising a delay circuit configured to delay the at least one rank change signal, wherein the rank signal comparison circuit is configured to:
compare at least one delayed rank change signal to the at least one rank change signal to determine that the first memory rank indicated by the at least one delayed rank change signal is different from the second memory rank indicated by the at least one rank change signal.

5. The semiconductor system of claim 4, wherein the rank signal comparison circuit further comprises an exclusive or (XOR) logic gate configured to perform the comparison of the at least one delayed rank change signal to the at least one rank change signal, wherein the at least one rank change signal indicates rank information using a logic level combination.

6. The semiconductor system of claim 1, wherein the controller comprises a register circuit configured to store and output:
a preamble period signal including information on the preamble period;
a post-amble period signal including information on the post-amble period; and
a burst length signal including information on a burst length.

7. The semiconductor system of claim 6, wherein the register circuit is further configured to store and output:
a write latency signal including information on latency for write operations.

8. The semiconductor system of claim 1, wherein the controller comprises an operation period signal generation circuit configured to generate an operation period signal based on the first write command and a burst length signal including information on a burst length, wherein the operation period signal indicates when the first write operation is being performed.

9. The semiconductor system of claim 1, wherein the controller comprises command generation circuit comprising a code comparator configured to generate a comparison signal based on a preamble period signal and a post-ample period signal, wherein:
the preamble period signal indicates a length of the preamble period;
the post-amble period signal indicates a length of the post-amble period; and
the comparison signal indicates which of the preamble period and the post-amble period is longer.

10. The semiconductor system of claim 1, wherein the controller comprises command generation circuit configured to, when the preamble period is longer than the post amble period, generate the second write command so that the transition time interval is based on the preamble period.

11. The semiconductor system of claim 10, wherein the transition time interval is half a burst length of the first write operation plus the preamble period.

12. The semiconductor system of claim 1, wherein the controller comprises command generation circuit configured to, when the preamble period is shorter than the post amble period, generate the second write command so that the transition time interval is based on the post-amble period.

13. The semiconductor system of claim 12, wherein the transition time interval is half a burst length of the first write operation plus the post-amble period plus one clock cycle of a clock associated with encoding the first and second data.

14. A controller for controlling a semiconductor device to successively write to different memory ranks, the controller comprising:
a command generation circuit configured to:
determine, while a first write operation to a first memory rank is being performed, that a second write operation to a second memory rank different from the first memory rank is to be next performed;
generate a second write command for the second write operation based on a comparison of durations of a post-amble period for the first write operation and a preamble period for the second write operation.

15. The controller of claim 14 further comprising an operation period signal generation circuit configured to generate an operation period signal based on a first write command for the first write operation, a burst length signal, and a write latency signal, wherein the operation period signal indicates when the first write operation is being performed.

16. The controller of claim 14 further comprising a rank change signal generation circuit configured to generate a rank change signal based on at least one write request and an address information signal, wherein the rank change signal indicates that the second memory rank is different from the first memory rank.

17. The controller of claim 14 further comprising a register circuit configured to store and output:
a preamble period signal including information on the preamble period;
a post-amble period signal including information on the post-amble period; and
a burst length signal including information on a burst length.

18. A method performed by a controller for generating a write command to write to a different memory rank from a preceding memory rank written to, the method comprising:

determining that a first write operation to a first memory rank is being performed;

determining that a second memory rank to be next written to in a second write operation is different from the first memory rank;

comparing durations of a preamble period and a post-amble period for a data strobe signal; and generating a write command for the second write operation at a time so that a transition time interval between initiation of the first write operation and initiation of the second write operation is based on the determination that the second memory rank is different from the first memory rank and based on the comparison of the durations of the preamble period to the post-amble period.

19. The method of claim 18, wherein:

comparing the durations of the preamble period and the post-amble period comprises determining that the preamble period is longer than the post amble period; and generating the write command for the second write operation comprises generating the write command so that the transition time interval is half a burst length of the first write operation plus the preamble period.

20. The method of claim 18, wherein:

comparing the durations of the preamble period and the post-amble period comprises determining that the preamble period is shorter than the post amble period; and generating the write command for the second write operation comprises generating the write command so that the transition time interval is half a burst length of the first write operation plus the post-amble period plus one clock cycle of a clock associated with encoding data for the first and second write operations.

* * * * *